(12) United States Patent
Chen

(10) Patent No.: US 6,661,676 B1
(45) Date of Patent: Dec. 9, 2003

(54) PROTECTIVE SHIELDING ASSEMBLY FOR ELECTRIC FACILITIES

(75) Inventor: I-Tao Chen, Hsin Chuang (TW)

(73) Assignee: Global Sun Technology Inc., Taipei (TW)

( * ) Notice: Subject to any disclaimer, the term of this patent is extended or adjusted under 35 U.S.C. 154(b) by 0 days.

(21) Appl. No.: 10/226,694

(22) Filed: Aug. 21, 2002

(51) Int. Cl.[7] ............................................... H05K 9/00
(52) U.S. Cl. ...................... 361/816; 361/800; 361/818; 361/737; 428/901; 248/407; 248/230.7
(58) Field of Search ................................ 361/816, 818, 361/800, 720, 748, 825, 737; 428/901; 248/200, 117.6, 117.7, 407, 230.7, 339

(56) References Cited

U.S. PATENT DOCUMENTS 3,851,222 A * 11/1974 Michalak et al. ........... 361/757
4,427,254 A * 1/1984 Koppensteiner ......... 439/476.1
5,986,892 A * 11/1999 Hargy, III .................... 361/759
6,091,605 A * 7/2000 Ramey et al. ............... 361/737

* cited by examiner

Primary Examiner—David Martin
Assistant Examiner—Hung Bui

(57) ABSTRACT

A protective shielding device includes a circuit board having a notch and one or more holes formed in one side, and a shielding member engaged onto the circuit board for shielding the circuit board and having a leg extended from one side for engaging through the notch and for extending toward the lower portion of the circuit board. The leg includes one or more catches for engaging into the holes and for latching the shielding member to the circuit board. The other sides of the shielding member and the circuit board may then be secured together with fasteners.

5 Claims, 4 Drawing Sheets

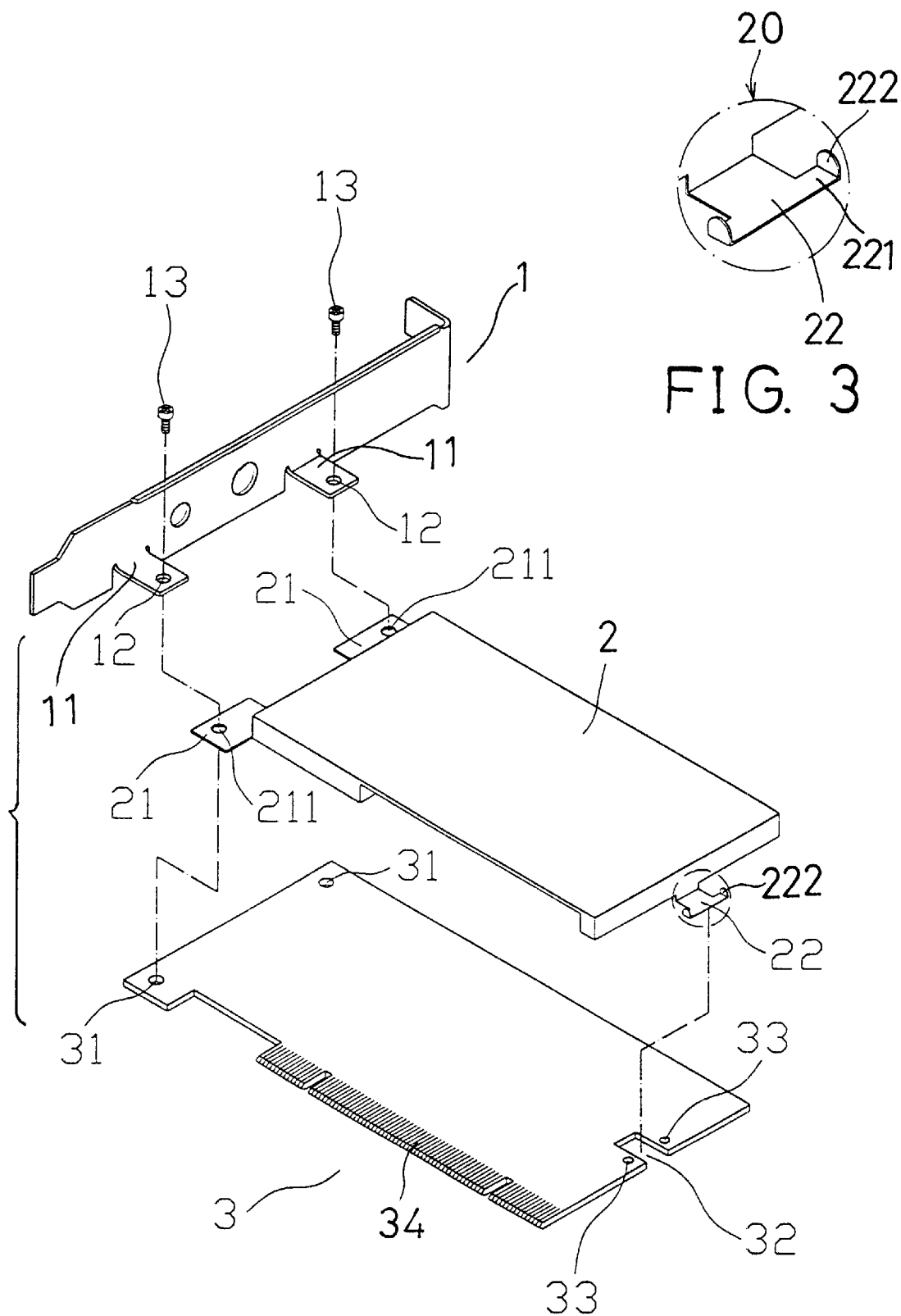

PROTECTIVE SHIELDING ASSEMBLY FOR ELECTRIC FACILITIES

BACKGROUND OF THE INVENTION

1. Field of the Invention

The present invention relates to a shielding assembly, and more particularly to a protective shielding assembly for shielding and protecting circuit boards of electric facilities.

2. Description of the Prior Art

Typical electric facilities may comprise a number of circuit boards disposed therein. However, normally, the circuit boards are not protected and shielded, and may thus be easily hit or damaged by the other objects or by the workers inadvertently, particularly while installing or repairing the circuit boards of the electric facilities.

The present invention has arisen to mitigate and/or obviate the afore-described disadvantages of the conventional shielding devices for circuit boards of electric facilities.

SUMMARY OF THE INVENTION

The primary objective of the present invention is to provide a protective shielding assembly for shielding or protecting circuit boards of electric facilities, and for preventing the circuit boards from being hit or damaged by the other objects or workers inadvertently.

In accordance with one aspect of the invention, there is provided a protective shielding assembly for an electric facility, the shielding assembly comprising a circuit board including a first side having a notch and at least one hole formed therein, and including a second side, and including an upper portion and a lower portion, a shielding member engaged onto the upper portion of the circuit board for shielding the circuit board, and including a first side having a leg extended therefrom for engaging through the notch of the circuit board and for extending toward the lower portion of the circuit board, the leg including at least one catch extended therefrom for engaging into the hole of the circuit board, the shielding member including a second side opposite to the leg thereof, and means for securing the second sides of the shielding member and the circuit board together.

The leg includes an extension extended therefrom and having the catch extended from the extension thereof.

The circuit board includes at least one terminal extended outwardly beyond the shielding member for coupling purposes.

The securing means includes a bracket, and at least one fastener engaged through the bracket and the second sides of the shielding member and the circuit board for securing the second sides of the shielding member and the circuit board together.

The bracket includes at least one ear extended therefrom and having an orifice formed therein, the second side of the shielding member includes at least one flap extended therefrom and having an orifice formed therein for aligning with the orifice of the ear, the second side of the circuit board includes at least one aperture formed therein and aligned with the orifices of the ear and the flap, for receiving the fastener.

Further objectives and advantages of the present invention will become apparent from a careful reading of a detailed description provided hereinbelow, with appropriate reference to accompanying drawings.

BRIEF DESCRIPTION OF THE DRAWINGS

FIG. 2 is an exploded view of the protective shielding assembly for the circuit board;

FIG. 3 is an enlarged partial perspective view of the protective shielding assembly;

DETAILED DESCRIPTION OF THE PREFERRED EMBODIMENT

Figure 1:
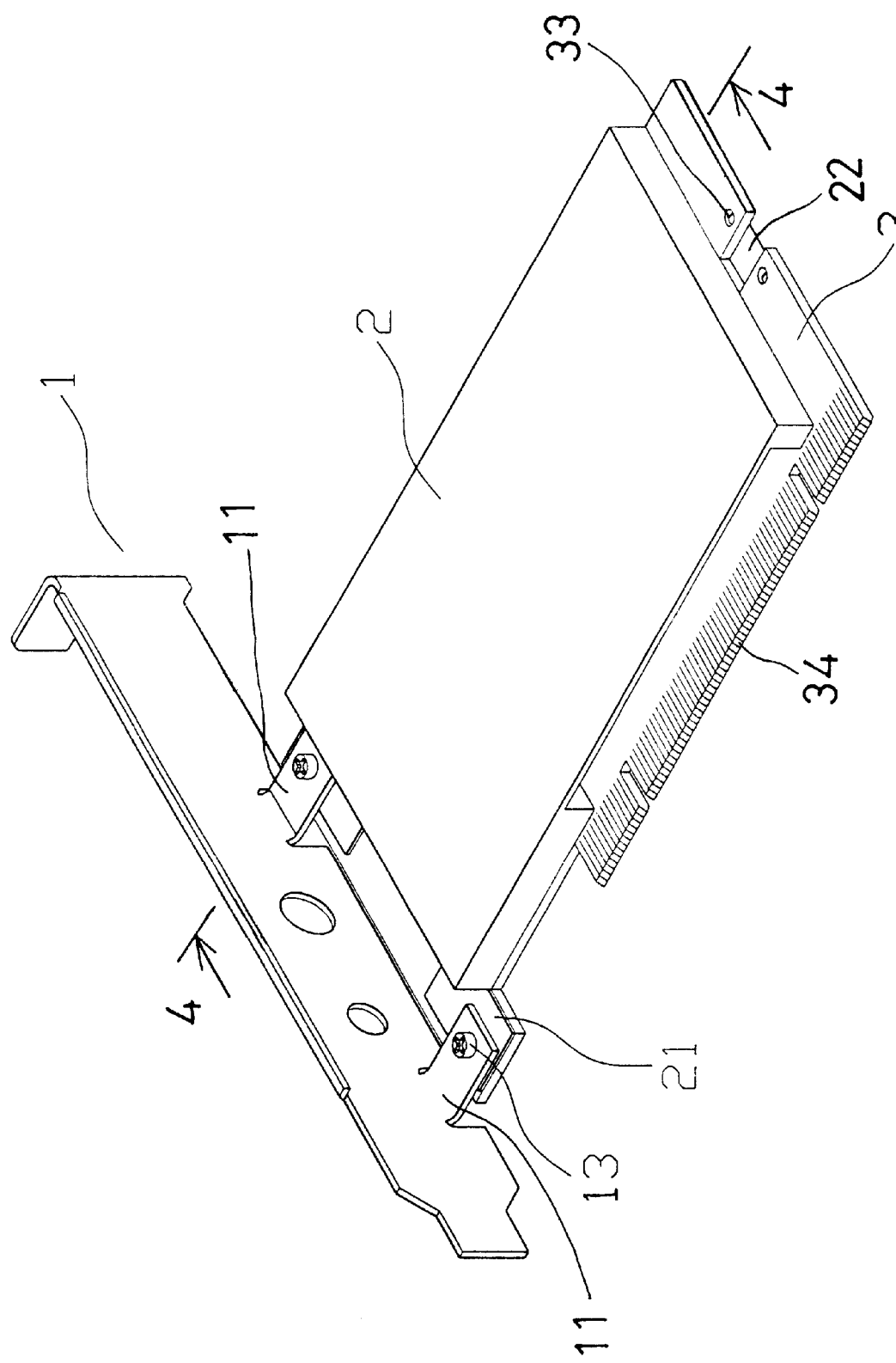
FIG. 1 is a perspective view of a protective shielding assembly in accordance with the present invention for shielding or protecting a circuit board of an electric facility.
Figure 4:
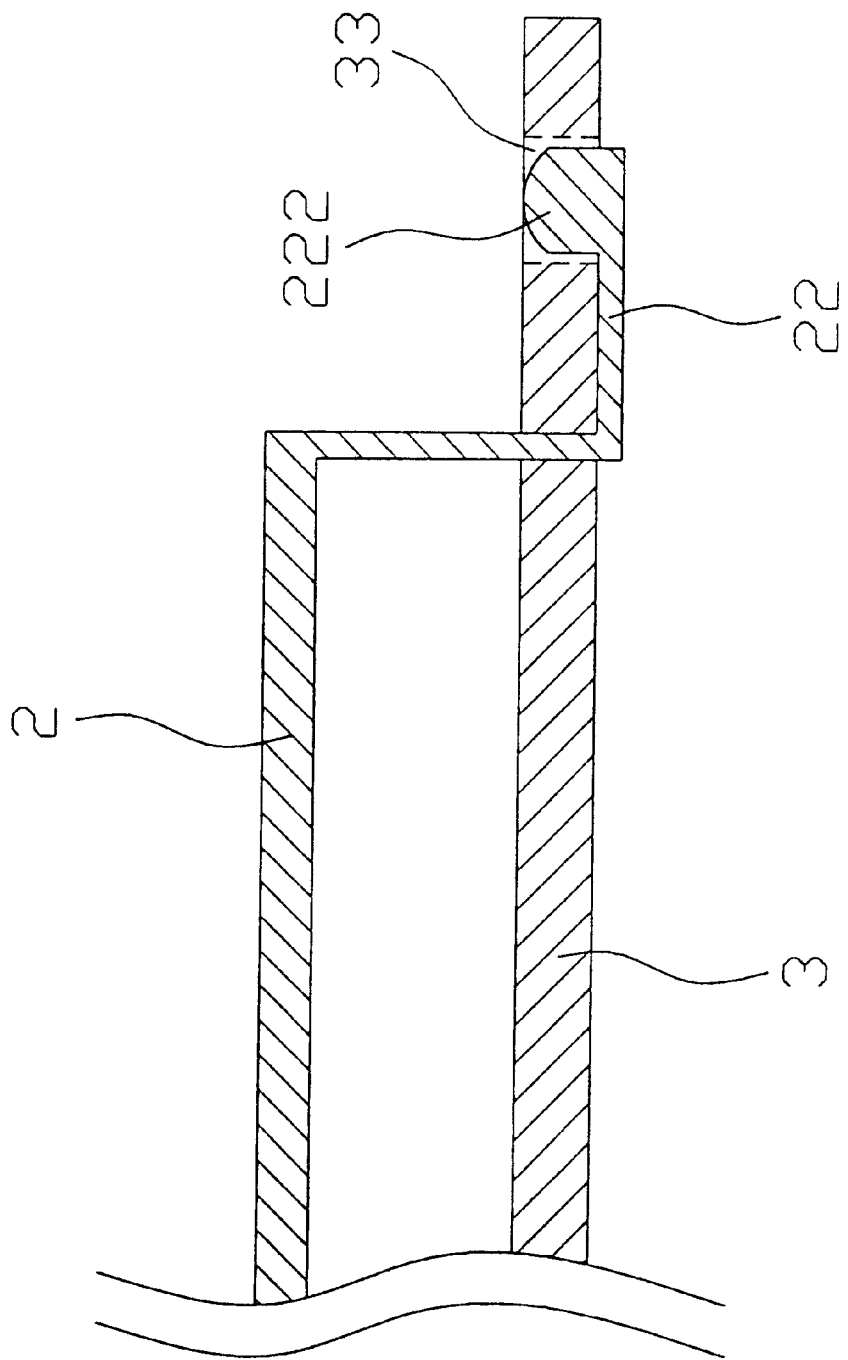
FIG. 4 is a partial cross sectional view taken along lines 4—4 of FIG. 1.

Referring to the drawings, and initially to FIGS. 1–4, a protective shielding assembly in accordance with the present invention is provided for shielding or protecting a circuit board 3 of an electric facility, such as a computer device (not shown), and comprises a typical bracket 1 for attaching to such as the computer device.

The bracket 1 includes one or more, such as two ears 11 laterally extended therefrom and each having an orifice 12 formed therein for receiving fasteners 13 therein. The bracket 1 may be attached or secured to such as the computer devices with latches or fasteners, or by force-fitted engagements as that for the typical computer devices.

A circuit board 3 includes one or more apertures 31 formed in one side thereof and aligned with the orifices 12 of the ears 11 of the bracket 11, for receiving the fasteners 13 therein, and includes a notch 32 and one or more holes 33 formed in the other side thereof, opposite to the apertures 31 thereof.

It is preferable that the notch 32 is formed in the middle portion of the other side of the circuit board 3, and the holes 33 are formed beside the notch 32 of the circuit board 3. The circuit board 3 preferably includes one or more plugs or conductors or terminals 34 provided on the other side thereof, other then the sides having the apertures 31 and the holes 33 formed therein.

A shielding member 2 is to be engaged onto the upper portion of the circuit board 3 for partially or completely shielding or covering the circuit board 3, and includes one or more flaps 21 laterally extended therefrom and each having an orifice 211 formed therein for aligning with the orifices 12 of the ears 11 and the apertures 31 of the circuit board 3 respectively.

It is to be noted that the circuit board 3 may include a number of typical electric parts or elements (not shown) disposed thereon. The shielding member 2 may be used for covering or shielding and protecting the electric parts or elements, and for preventing the electric parts or elements from being hit or damaged by the other objects or workers. The terminals 34 of the circuit board 3 are preferably extended outwardly beyond the shielding member 2 (FIG. 1).

The fasteners 13 may be engaged through the orifices 12 of the ears 11 and the orifices 211 of the flaps 21 and the apertures 31 of the circuit board 3 respectively, for detachably securing the one sides of the shielding member 2 and the circuit board 3 to the bracket 1.

The shielding member 2 includes a leg 22 extended from the other side thereof, opposite to the flaps 21, for engaging through the notch 32 of the circuit board 3, and for extending downward beyond the bottom portion of the circuit board 3, best shown in FIGS. 1 and 4–6.

The shielding member 2 further includes one or more extensions 221 laterally extended from the leg 22 of the shielding member 2, and each having a hook or a catch 222 extended therefrom, such as extended upwardly therefrom for engaging through the holes 33 of the circuit board 3, and for detachably hooking or latching the other side of the shielding member 2 to the circuit board 3.

Figure 5:
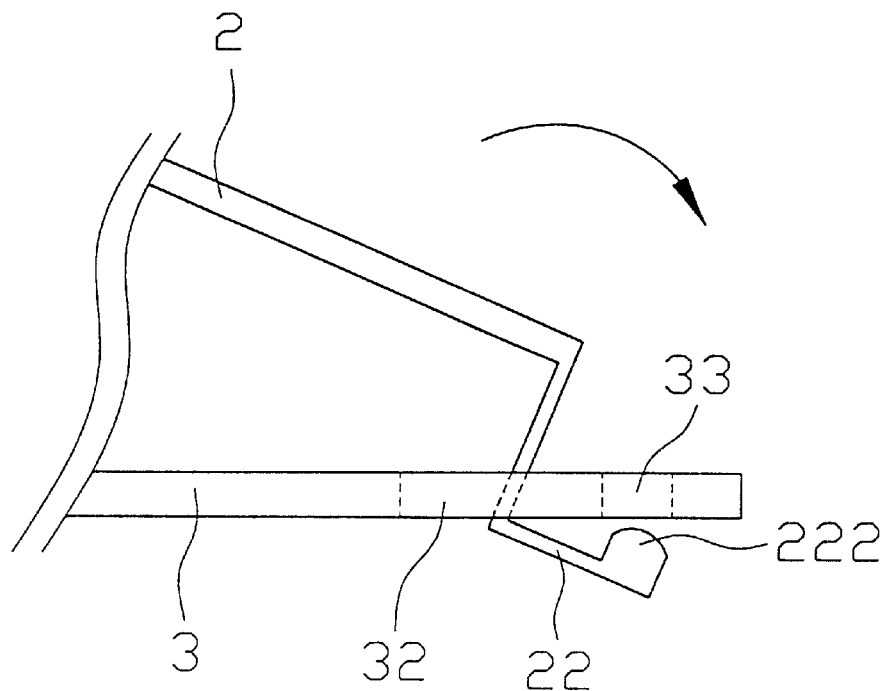
FIGS. 5 and 6 are schematic views illustrating the operation of the protective shielding assembly for the circuit board.
Figure 6:
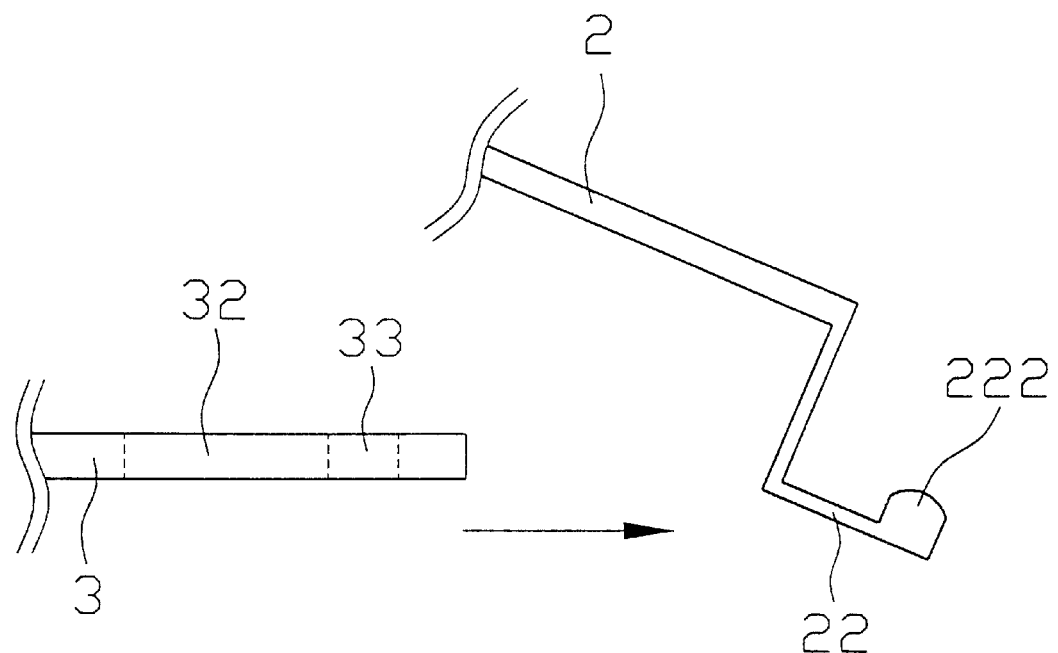

While assembling the shielding member 2 to the circuit board 3, the shielding member 2 is first tilted relative to the circuit board 3 for engaging the leg 22 of the shielding member 2 through the notch 32 of the circuit board 3, and for engaging the leg 22 downwardly beyond the bottom portion of the circuit board 3 (FIG. 5).

The shielding member 2 is then rotated or moved toward or onto the circuit board 3 for engaging the catches 222 into the holes 33 of the circuit board 3 respectively, and thus to detachably hook or latch the other side of the shielding member 2 to the circuit board 3. The flaps 21 of the shielding member 2 may then be secured to the circuit board 3 and the bracket 1 with the fasteners 13.

The bracket 1 and the fasteners 13 may thus be used as a fastening means for detachably securing the one sides of the circuit board 3 and the shielding member 2 together, after the catches 222 of the leg 22 have been hooked or latched into the holes 33 of the circuit board 3.

While disengaging or removing the shielding member 2 from the circuit board 3, the fasteners 13 are unthreaded or disengaged from the flaps 21 of the shielding member 2 and the circuit board 3 and the bracket 1, and the shielding member 2 may then be tilted relative to the circuit board 3 again (FIG. 5) to disengage the catches 222 from the holes 33 of the circuit board 3 (FIG. 6), and thus to disengage the shielding member 2 from the circuit board 3.

It is to be noted that the notch 32 of the circuit board 3 is shown and illustrated to be opened relative to the circuit board 3, however, the notch 32 may also be formed within the circuit board 3 and may include an enclosed structure having an area great enough for receiving the leg 22 and the catches 222 of the leg 22.

It is further to be noted that, in addition to the protection to the electric parts or elements, the shielding member 2 may also be used to blocking or confining or limiting the electromagnetic field that may be generated by some of the electric parts or elements, for preventing the electromagnetic field from interfering the other electric parts or elements.

Accordingly, the protective shielding assembly in accordance with the present invention may be used for shielding or protecting circuit boards of electric facilities, and for preventing the circuit boards from being hit or damaged by the other objects or workers inadvertently.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

I claim:

1. A protective shielding assembly for protecting and shielding a circuit board of an electric facility, the circuit board including a first side having a notch and at least one hole formed therein and including a second side, and the first and the second sides of the circuit board each including an upper portion and a lower portion, said shielding assembly comprising:

a shielding member for engaging onto said upper portion of said circuit board and including a first side having a leg extended therefrom to extend through said notch of said circuit board and to extend from said upper portion of said first side of said circuit board toward said lower portion of said first side of said circuit board, said leg including at least one catch extended therefrom to extend into said at least one hole of said circuit board, said shielding member including a second side opposite to said leg thereof, and means for securing said second side of said shielding member to said second side of said circuit board.

2. The shielding assembly according to claim 1, wherein said leg includes an extension extended therefrom and having said at least one catch extended from said extension thereof.

3. The shielding assembly according to claim 1, wherein said circuit board includes at least one terminal extended outwardly beyond said shielding member.

4. The shielding assembly according to claim 1, wherein said securing means includes a bracket, and at least one fastener engaged through said bracket and said second sides of said shielding member and said circuit board for securing said second sides of said shielding member and said circuit board together.

5. The shielding assembly according to claim 4, wherein said bracket includes at least one ear extended therefrom and having an orifice formed therein, said second side of said shielding member includes at least one flap extended therefrom and having an orifice formed therein for aligning with said orifice of said at least one ear, said second side of said circuit board includes at least one aperture formed therein and aligned with said orifices of said at least one ear and said at least one flap, for receiving said at least one fastener.

* * * * *